United States Patent
Kneer et al.

(10) Patent No.: US 9,696,631 B2
(45) Date of Patent: **\*Jul. 4, 2017**

(54) METHOD FOR STRESS-ADJUSTED OPERATION OF A PROJECTION EXPOSURE SYSTEM AND CORRESPONDING PROJECTION EXPOSURE SYSTEM

(71) Applicant: Carl Zeiss SMT GmbH, Oberkochen (DE)

(72) Inventors: Bernhard Kneer, Altheim (DE); Markus Deguenther, Aalen (DE); Toralf Gruner, Aalen-Hofen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/742,176

(22) Filed: Jun. 17, 2015

(65) Prior Publication Data

US 2016/0062245 A1    Mar. 3, 2016

Related U.S. Application Data

(63) Continuation of application No. 13/590,673, filed on Aug. 21, 2012, now Pat. No. 9,086,637, which is a
(Continued)

(30) Foreign Application Priority Data

Feb. 26, 2010   (DE) .................. 10 2010 002 383

(51) Int. Cl.
*G03B 27/54*   (2006.01)
*G03F 7/20*   (2006.01)

(52) U.S. Cl.
CPC ........ *G03F 7/70191* (2013.01); *G03F 7/7085* (2013.01); *G03F 7/70116* (2013.01); *G03F 7/70341* (2013.01); *G03F 7/70558* (2013.01)

(58) Field of Classification Search
CPC .................. G03F 7/70116; G03F 7/70558
(Continued)

(56) References Cited

U.S. PATENT DOCUMENTS 6,078,380 A    6/2000   Taniguchi et al.
6,414,743 B1   7/2002   Nishi et al.
(Continued)

FOREIGN PATENT DOCUMENTS

DE   10 2006 027 787   1/2007
WO   WO 2005/026843    3/2005

OTHER PUBLICATIONS

International Search Report and Written Opinion for corresponding PCT Appl. No. PCT/EP2011/052953, dated Aug. 24, 2011.
(Continued)

*Primary Examiner* — Hung Henry Nguyen
(74) *Attorney, Agent, or Firm* — Fish & Richardson P.C.

(57) ABSTRACT

A projection exposure system and a method for operating a projection exposure system for microlithography with an illumination system are disclosed. The illumination system includes at least one variably adjustable pupil-defining element. The illumination stress of at least one optical element of the projection exposure system is determined automatically in the case of an adjustment of the at least one variably adjustable pupil-defining element. From the automatically determined illumination stress, the maximum radiant power of the light source is set or determined and/or in which an illumination system is provided with which different illumination settings can be made. Usage of the projection exposure system is recorded and, from the history of the usage, at least one state parameter of at least one optical element of the projection exposure system is determined.

21 Claims, 4 Drawing Sheets

Related U.S. Application Data continuation of application No. PCT/EP2011/052953, filed on Feb. 28, 2011.

(60) Provisional application No. 61/308,344, filed on Feb. 26, 2010.

(58) Field of Classification Search
USPC .................. 355/53, 67–71; 356/399–401
See application file for complete search history.

(56) References Cited

U.S. PATENT DOCUMENTS

| | | |
|---|---|---|
| 6,424,405 B2 | 7/2002 | Kurosawa et al. |
| 6,813,004 B1 | 11/2004 | Horikoshi et al. |
| 9,086,637 B2 * | 7/2015 | Kneer ................. G03F 7/70116 |
| 2003/0219056 A1 | 11/2003 | Yager et al. |
| 2005/0190350 A1 * | 9/2005 | Shinoda ............. G03F 7/70258 |
| | | 355/53 |
| 2005/0237506 A1 * | 10/2005 | Reisinger ............... G03B 27/52 |
| | | 355/55 |
| 2008/0002167 A1 | 1/2008 | Gruner et al. |
| 2008/0151221 A1 | 6/2008 | Sogard |
| 2013/0044303 A1 | 2/2013 | Kneer et al. |

OTHER PUBLICATIONS

International Preliminary Report on Patentabilty for corresponding PCT Appl No. PCT/EP2011/052953, dated Aug. 28, 2012.

German Examination Report, with English translation, for corresponding DE Appl No. 10 2010 002 383.3, dated Nov. 15, 2010.

\* cited by examiner

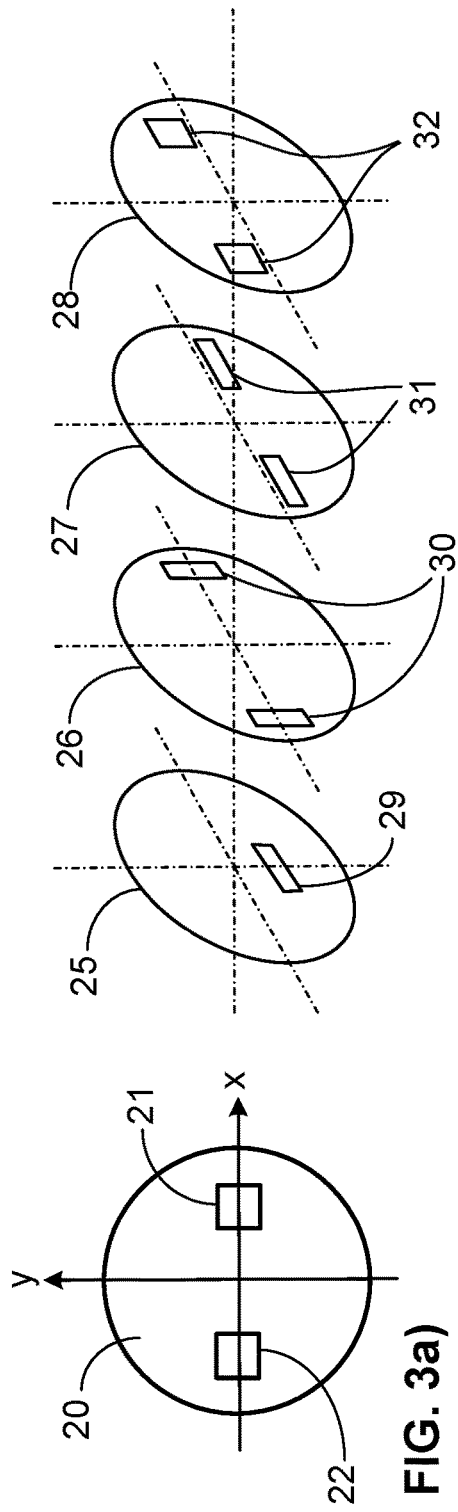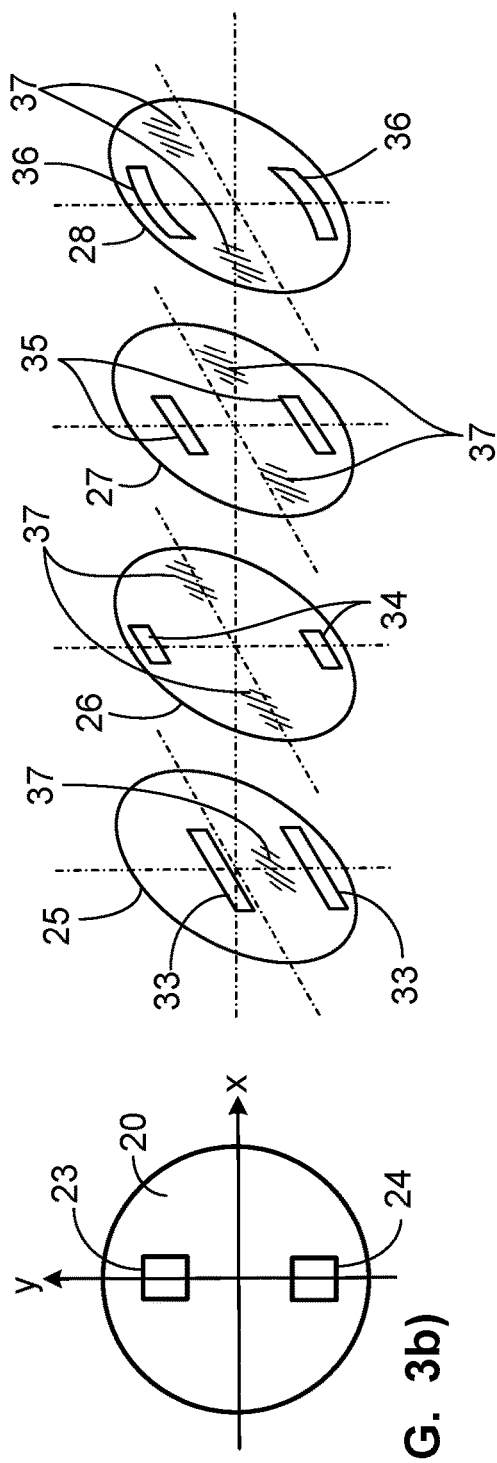
FIG. 3a)
FIG. 3b)

METHOD FOR STRESS-ADJUSTED OPERATION OF A PROJECTION EXPOSURE SYSTEM AND CORRESPONDING PROJECTION EXPOSURE SYSTEM

CROSS-REFERENCE TO RELATED APPLICATIONS

This application is a continuation of, and claims priority under 35 USC 120 to, U.S. application Ser. No. 13/590,673, filed Aug. 21, 2012, now U.S. Pat. No. 9,086,637, which is a continuation of, and claims benefit under 35 USC 120 to, international application PCT/EP2011/052953, filed Feb. 28, 2011, which claims benefit under 35 USC 119 of German Application No. 10 2010 002 383.3, filed Feb. 26, 2010 and under 35 USC 119(e) of U.S. Ser. No. 61/308,344, filed Feb. 26, 2012. U.S. application Ser. No. 13/590,673 and international application PCT/EP2011/052953 are hereby incorporated by reference in their entirety.

FIELD

The disclosure relates to a projection exposure system for microlithography and a method of operating a projection exposure system for microlithography having an illumination system in which different illumination settings can be made, especially on a variably adjustable pupil-defining element.

BACKGROUND

Projection exposure systems for microlithographic manufacturing processes for micro-structured or nano-structured components in electrical engineering and micro-mechanics commonly include an illumination system by which a reticle can be illuminated, and a projection lens with which a reduced image of the structure of the illuminated reticle is projected onto a corresponding substrate. For the purpose of achieving high resolution, it is desirable that the reticle be illuminated with oblique incident light. Therefore it is common for illumination settings to be chosen in which, in one pupil plane of the illumination system, illumination poles are provided outside the optical axis (such as annular illumination settings, dipole illumination settings or quadrupole illumination settings). To be able to produce such illumination settings, components are used in the illumination system that can be described as pupil-defining elements and can effect a corresponding light intensity distribution in the pupil plane, such as, for example, a dipole distribution, quadrupole distribution or annular intensity distribution. In addition to diffractive optical elements (DOEs), microlens arrays, or computer-generated holograms (CGHs), micromirror arrays (MMAs) can serve as pupil-defining elements.

Although such illumination settings yield advantages in terms of resolution, one drawback is that very high surface energy densities can be generated in the pupil planes or planes conjugated thereto and planes of the illumination system near the pupil on account of the intensity concentration of the light. For optical elements near the pupil, this means high-energy surface stress (high surface power density). This can lead to damage in the materials used for the optical elements. If an ArF laser operating at a wavelength of 193 nanometers is used, for example, for projection exposure systems, the chemical bonds of the quartz material commonly employed for the optical elements may rupture. This can lead to the formation of so-called colour centres which absorb light.

In addition to this damage, further damage can occur, such as changes in the density of the material. Both an increase in density (compaction) and a reduction in density (rarefaction) can take place. When optical materials are exposed to high energy stress, micro-channels can also form, in which mechanical destruction of the material is present. Accordingly, compaction can lead to stress-induced birefringence or polarization-induced birefringence.

The damage done to the optical materials is generally related to the energy density or the surface stress, but the behaviour is not necessarily linear. Thus, types of damage in certain optical materials can occur only once a certain threshold is exceeded, while other types of damage can occur at lower energy densities, with extensive damage leading to appreciable impairment being observed only at higher stresses. In addition, the damage can also increase with an increase in duration of the stresses. As a result, with each additional energy stress (e.g., in the form of a laser pulse), additional damage occurs, so that the damage can add up with the number of laser pulses until a permissible limit is exceeded.

In certain known systems, the power of the light source, i.e. the laser, is adjusted such that, for the proposed illumination setting, the surface stresses on the optical elements or the energy densities in the projection exposure system are below the critical values, so that damage to individual optical elements or the projection exposure system can be avoided. The associated restriction on the radiant power of the light source can lead to a lower throughput, as the substrates to be exposed involve longer exposure to the exposure beam, and also can render the projection exposure systems inflexible in use, as the radiant power needs to be adjusted for every illumination setting.

SUMMARY

The disclosure provides a projection exposure system and a method for operating a projection exposure system that facilitates, simply and reliably, flexible operation of the projection exposure system. A corresponding method can be simple to perform, and the corresponding projection exposure system can be simply constructed.

In an aspect, the disclosure provides a method of operating a projection exposure system for microlithography including at least one variably changeable component. The illumination stress of at least one optical element of the projection exposure system is determined automatically when there is a change in the at least one variably changeable component. From the automatically detected illumination stress, the maximum radiant power of the light source to be used is determined The disclosure proceeds from the recognition that, in modern projection exposure systems for microlithography, in which the illumination system is provided with variably adjustable pupil-defining elements for the rapid and variable setting of illumination settings, reliable operation is, in general, possible only when the illumination stress of at least one optical element of the projection exposure system is determined automatically in order that the automatically determined illumination stress may be used to set the maximum radiant power of the light source to be used. The use of variably adjustable pupil-defining elements can lead to a situation in which an illumination setting is selected in which very high radiation energy densities occur at the individual optical elements of the projection exposure system with the densities being capable of damaging the material and the optical element. Accordingly, the use of variably adjustable pupil-defining elements depends on simultaneously determining the illumination stress automatically and providing a corresponding apparatus for a corresponding projection exposure system.

As a projection exposure system is usually provided with a projection system or a projection lens for imaging the reticle structure onto the substrate in addition to the illumination system, spatially different illumination stresses on optical elements in the projection lens can also arise from diffraction of the imaging light at the reticle. Accordingly, the disclosure can be utilised not only in the case of variably adjustable and/or replaceable pupil-defining elements, but also, e.g., in systems in which reticle replacement leads to different illumination stresses on optical elements of the projection exposure system, i.e. both in the illumination system and in the projection lens or projection system. In general, the disclosure can be used in projection exposure systems in which, due to at least one adjustable component, different illumination stresses can occur on optical elements in the projection exposure system, for example due to different illumination settings in the illumination system or to other, altered conditions in the projection exposure system, such as altered diffraction and transmission conditions in the case of replaceable transmission reticles.

Accordingly, the disclosure can be used in projection exposure systems which have at least one variably adjustable, in particular adjustable and/or replaceable component, such as adjustable or replaceable pupil-defining elements, which, because of their adjustability, replaceability or general amenability to alteration, can give rise to different illumination stresses at least in one optical element of the projection exposure system. The variably adjustable or replaceable component here in this respect can be formed by an illumination system in which different illumination settings can be made, especially an illumination system with a variably adjustable and/or replaceable pupil-defining element, or can also be formed by replaceable or adjustable reticles. The projection exposure system can also be used for the exposure of different-sized semiconductor devices, wherein the length of the imaged field can vary. This variation can be realised either by adjustable elements ("reticle masking blades"=REMA blades, micro-mirror arrays for field forming) or replaceable field-forming elements (e.g. micro-lens array) and, as light is barely blocked out but rather is undistributed, leads to different energy densities on optical surfaces.

The illumination stress can thereby be determined for at least one optical element of the projection exposure system, such as the most sensitive optical element, or for several optical elements or for all optical elements of the projection exposure system. The automatically determined illumination stress can serve to choose the maximum radiant power of the light source such that damage to the weakest or most exposed optical element is avoided.

However, since, as mentioned previously, different types of damage can occur, the history of the radiation or illumination stress is of significance, especially for types of damage in which the damage adds up over the period of the illumination stress.

Accordingly, in another aspect of the disclosure, for which protection is sought separately from and independently of the previously described aspect of the disclosure and in combination with this aspect, it is proposed that records be kept of the usage of the projection exposure system as a function of the setting of the variably adjustable component and in particular of the different illumination settings, and that at least one state parameter be determined for at least one optical element of the projection exposure system from the recorded usage of the projection exposure system, i.e. the history of the illumination stress on the optical element, that provides information about existing damage. This allows account to be taken of the fact that, over the period of usage, damage has already occurred to the optical elements of a projection exposure system that can lead to damage upon further illumination stress. Were only threshold values pertaining to immediate damage to be taken into consideration, a single illumination stress would be deemed uncritical, which, however, because of the pre-existing damage in the optical element's history could lead to damage.

Recording of projection exposure system usage and determination of a state parameter can be done only for a single optical element of the projection exposure system, which, for example, is classified as a very important optical element, or for several or all optical elements of the projection exposure system.

The state parameter(s) can include values which indicate the refractive index of the corresponding optical element, the transmission capacity, the absorption properties and the light-scattering or birefringence behaviour of the optical element and changes thereto. The corresponding data can be estimated using models, too.

To acquire the knowledge about the illumination stress of the optical element for the recorded usage of the projection exposure system and the determination of a state parameter of an optical element, the determination of the illumination stress for different settings, especially illumination settings in accordance with the realisation of the first aspect of the disclosure, can proceed automatically. This applies particularly to the use of a variably adjustable pupil-defining element. The illumination stresses for the individual optical elements of the projection exposure system can also be determined individually at different settings of a variably adjustable component, especially in the case of different illumination settings, e.g. for different pupil-defining elements. The determined illumination stresses can be used along with information about the respective operating time to determine or estimate the damage which it is feared has already occurred. For the purposes of the present description, by operating or usage life is meant the number of or time integral of the pulses, e.g., laser pulses, in the case of pulsed illumination.

On account of the determined state parameters of the optical elements, the corresponding radiant power of the light source can then also be set, in particular automatically, or a lifetime assessment can be made.

Overall, in accordance with the disclosure, a fully automatic system can be provided, in which, for a particular setting, especially illumination setting, e.g., a particular setting of a variably adjustable pupil-defining element, the illumination stresses of individual or all optical elements of the projection exposure system can be automatically determined and, in conjunction with the stored state parameters for the optical elements, the light source's radiant power can be set automatically or at least corresponding information be provided about the expected damage to optical elements or the residual lifetime of individual optical elements or the projection exposure system. Thus, highly variable operation with, e.g., rapid illumination switchovers or reticle replacement can be implemented, without the need to fear any adverse effect on the projection exposure system or damage to the same or to individual optical components thereof.

The illumination stress can be determined for the at least one optical element, preferably however for several or all optical elements on the basis of an assumed power of the light source, with either the optimum power value for rapid substrate throughput or a preliminary estimated power value at which, for example, no damage is feared, serving as the assumed power. Insofar as no functional relationship is known to exist between the radiant power of the light source and the illumination stress of individual optical elements, the illumination stress can be determined iteratively by gradually altering the radiant power of the light source and determining, especially measuring, the energy input into corresponding optical elements.

The illumination stress can be described as surface power density, i.e. as radiant energy per unit area.

The illumination stress can be defined as the pulse- or time-based surface energy density of units $mJ/(cm^2\ pulse)$ or $mJ/(cm^2\ s) = mW/cm^2$.

Although the illumination stress, as already mentioned above, can be performed only for one optical element, for example, probably the most exposed optical element, determination of the illumination stress for several, and especially all optical elements of the projection exposure system, is advantageous, as the value which is to be set for the maximum radiant power of the light source to be used is determined by the fact that the most exposed optical element and/or the element with the weakest material damage is not damaged.

The illumination stress of an optical element can be spatially resolved across the optical surface, so that, especially with regard to the recording and determination of the state parameters of the optical element, spatially resolved determination of any pre-damage is possible. In particular, optical fields in near-field optical elements that are used to different extents may experience variable radiation stresses, up to and including non-irradiated regions. This too can be recorded accordingly.

In addition to punctiform, spatially resolved determination of the illumination stress of an optical element, the average illumination stress over certain areas or sectors of the optical active areas of the optical element can be determined in a simplified calculation.

The illumination stress can be calculated, i.e. simulated, on the basis of the ray path or the optical conditions, or be determined by actual measurements. It is also possible to combine theoretical calculations and practical measurement, such that measurements can be made in some regions of the projection exposure system's optics that are used to calculate estimates for optical elements in other regions of the projection exposure system.

For example, where the light distribution in the pupil is known, which is defined by corresponding light-defining elements or variably adjustable components, such as mirror arrays and the like, a Monte Carlo calculation can serve to calculate the ray path or the ray distribution throughout the system, i.e. in the illumination system and/or the projection lens. Accordingly, the energy which is introduced into the optical elements can be determined, with allowance made for energy loss due to transmission by the various elements. For surface elements, the energy of the rays passing through can be aggregated. If desired, normalization can also take place accordingly. It is thus possible in this way to determine in a purely theoretical manner so-called adjustment equations which characterise the surface power density of the respective optical elements or the respective optically active surfaces as a function of illumination, i.e. especially of the light source and pupil definition. Such adjustment equations, which approximate to polynomials or other adjustment equations, can then be used to determine the illumination stress. Where applied to the projection lens, the light distribution in the entrance pupil of the projection lens is determined, for which purpose the diffraction of the light rays at the reticle are taken into account. For this, it is desirable to know the structures on the mask (reticle). However, to an approximation, an unstructured mask (reticle) can serve as the starting point as it can represent the worst case, i.e. the case of highest illumination stress.

Another way to determine the illumination stress can be to make simulations and/or calibration measurements of the stresses for certain, representative illumination settings and/or reticles, i.e. certain pupil fills and mask layouts, such that the real stress case, i.e. the case of specific pupil illumination, is taken into account by scaling the representative measurements or calculations. For example, where uniformly-filled illumination poles for near-pupil elements are used, the real stress can be determined from the product of the representative stress (stress during calibration) and the ratio of the pole sizes in the calibration case (representative measurement or calculation) to the real pole size. The corresponding equation is $$Stress_{real} = Stress_{calibration\ case} * (pole\ size_{calibration\ case} / pole\ size_{real})$$

Corresponding rules for the calibration can find application for any optical elements. For example, for near-field optical elements, account can be taken of the fact that the stress is roughly halved if the poles are oriented perpendicularly to the longitudinal side of the field extension. In this case, advantage is taken of the fact that, in near-field optical elements to a pole, a light distribution is created that resembles a corresponding field shape. In the case of dipoles which are oriented along the longitudinal side of the field, overlap of the distributions occurs, so that this case can be considered a calibration case or representative case. However, if the poles are arranged perpendicularly to the longitudinal side of the field by their connecting axis, overlapping of the near-field light distribution does not occur, with the result that the stress is roughly half as high as in the representative case in which the dipoles are arranged with their connecting axis parallel with the longitudinal side of the field.

For the purpose of determining the illumination stress, therefore, a reference illumination can also be used, for which the radiation intensity at different optical elements, for example, has been measured. Proceeding from this knowledge, the illumination stress for other illumination settings can then be automatically calculated.

Insofar as measured data are used to determine the illumination stress, they can be stored in a corresponding storage unit of a computing unit.

The determination of the illumination stress can correspondingly also be typologically categorised for different illumination settings. The typological determination of the illumination stress can be based on different types of illumination, such as a dipole illumination with dipoles along the x-axis of the optical system or along the y-axis or an annular illumination setting and the like. For such types of illumination settings, it is then possible to simply define regions of higher radiation stress and regions with lower radiation stress. Accordingly, such an approach simplifies recording of the illumination stress.

Further simplification, e.g., in terms of quantity of the data to be processed and stored, can consist in determining only the maximum illumination stress in relation to one optical element and/or for several or all optical elements. As illumination stress can vary both over the optical surface of a single element and for individual optical elements, it is important to the determination of the maximum permissible radiant power of the light source that both the maximum illumination stress on the individual optical element and for the various optical elements be known. Only the optical element of maximum stress or the region of a single optical element of maximum illumination stress then needs to be compared with threshold or limit values for the optical materials. For example, where various optical elements are made from the same material, only checking whether the threshold or limit values of the most-exposed element have been exceeded is involved. For the purposes of recording the usage and determining the state parameters of the optical elements, however, aside from the maximum illumination stress of the individual optical element or several optical elements, illumination stress at lower radiation intensities is also important, as they may also contribute to damage over the lifetime of the optical element. Accordingly, from the point of view of recording and determining a state parameter of the optical element, it is especially important for the illumination stress to be determined in spatial resolution over the individual optical element.

Recording of the illumination setting can include the type of the illumination setting, for example, the illumination type, such as dipole illumination or annular illumination, and the duration of illumination and/or the intensity of the illumination stress and/or the surface power density and the spatial distribution of the illumination stress at one or more optical elements.

The duration of the illumination includes especially the number of laser pulses and the duration of the individual laser pulses if a pulsed laser serves as light source for the projection exposure system. This makes it possible, e.g., to calculate a total illumination time for the optical elements of the projection exposure system.

The typological approach to recording the type of illumination setting can already furnish evidence of more-exposed regions and less-exposed regions.

In addition, recording the spatial distribution of the illumination stress can yield precise information about the location of possible damage.

The intensity of the illumination stress is a measure of the damage wrought to the material of the optical element by any illumination.

A state parameter can contain information about different spatial regions or sectors of an optical element, or several state parameters can be determined for the different areas or sectors.

The state parameter can in particular include an integrated overall illumination stress as a function of time, that is, usage period, i.e. aggregated usage period in the sense of actual illumination or number of pulses in the case of pulsed illumination and/or the intensity of the illumination stress. Here, the nature of the damage or the damage mechanism plays a role. Thus, any radiation or illumination stress, even of very low intensity, can contribute to further development of the damage, such that all illumination stresses are aggregated. In addition, many instances of damage are the result of radiation stress above a certain intensity for a specific duration, such that both the time element and the energy density of the stress play a role. Accordingly, the state parameter can constitute an integrated overall illumination stress as a function of time and/or intensity of illumination. In addition, the state parameter can already include information on the expected damage to the material and/or threshold or limit values. However, this information can also be stored in the system independently of the state parameter.

The determined values for expected illumination stress can be compared with one or more stored threshold values and/or with one or more determined state parameters for the optical elements in order that the radiant power of the light source may be adjusted and/or a residual lifetime prediction made. If it is found, for example, that the illumination stress determined for at least one optical element exceeds a threshold value, the radiant power of the light source can be automatically lowered to avoid damage to this optical element. Additionally or alternatively, the expected illumination stress, which has been determined in accordance with the intended illumination setting, can be compared with one or more state parameters which have been determined for the optical elements of the projection exposure system in order to establish whether or not illumination of one or more optical elements at the intended values would lead into the damage region, or the impact of illumination stress on the future service lifetime. Aside from a preferably automatic adjustment of the radiant power of the light source, it is also possible to merely make provision for automated generation of proposals for the adjustment, so that the user can decide whether or not to follow these proposals.

Insofar as the relationship between the radiant power of the light source and the threshold stress at which damage just fails to occur in the most-exposed optical element is known, the radiant power of the light source to be set can be determined direct. Otherwise, the radiant power which is just tolerable can be determined in an iterative approach by repeatedly determining the illumination stress and making comparisons with corresponding threshold values and limit values, i.e., where the relationship between the change in radiant power of the light source and the change in the illumination stress of one or several optical elements is not known, the radiant power is gradually reduced and the corresponding illumination stress is determined until it falls below the threshold stress. In addition, as described above, the history of usage and/or the proposed usage can flow into the determination of the radiant power.

For the adjustment of the radiant power of the light source, so-called clipping factors can also be calculated that indicate the extent to which the radiant power is reduced, for example, from a maximum value.

For the determination of the radiant power of the light source to be used or the lifetime prediction, both the usage history and future usage can, as already described, also be incorporated. The usage history, for example, can be extrapolated to estimate what the future usage will be.

Alternatively or in addition, information about the proposed future usage can be requested from the user. It is also possible to base the determination of the radiant power to be used on a predefined scenario for future usage.

The overall outcome therefore is the possibility, proceeding from the actual damage to one or more optical elements, of ensuring variable usage of the projection exposure system, as a corresponding usage power can be set individually for each case of illumination stress, taking into account previous damage to the optical elements and expected damage during future usage. For example, a considerable period out of a total usage may have already elapsed without damage already having been done in an important region of an optical element at the current setting. In this case, despite the already existing usage period, high radiant power can be used which, in certain circumstances, is reduced after a certain period of intensive operation in order that the damage rate may be reduced, so that further usage may be bridged until scheduled maintenance, at which time the correspondingly damaged optical element can be replaced.

However, the projection exposure system could alternatively be further operated, for example, in a different illumination setting or with a different reticle at higher power, as other regions of the optical elements would be exposed at these new settings. In this way, usage of the projection exposure system can be optimised.

A similar process can be performed by an open- and/or closed-loop control unit, which can include different components, such as a determination unit for determining the illumination stress of at least one optical element and/or a recording unit for recording previous usage and an evaluation unit for determining state parameters of at least one optical element. Such an open- and/or closed-loop control unit can be formed in particular by a programmatically configured data processing unit, wherein the data processing unit can have storage memory for storing the determined state parameters, of threshold values for the optical elements and/or of threshold limits for the overall illumination stress. In particular, the open- and/or closed-loop control unit for the present method can also effect open- and/or closed-loop control over the remaining operation of a projection exposure system.

In particular, a corresponding projection exposure system for microlithography can include a mirror array or micromirror array (MMA) or other pupil-defining elements (PDEs), such as replaceable diffractive optical elements, and other adjustable or replaceable components, such as pinholes, grey filters, transmission-switchable elements etc., by which the illumination setting, i.e. especially the intensity distribution in the pupil plane, can be influenced.

The disclosure can be used especially in projection exposure systems and in particular in two subsystems, namely illumination system and projection lens or system which operate at light wavelengths of 400 nm or less, particularly 250 nm or less, preferably also in the EUV (extreme ultra violet) spectrum at 13.5 nm or 7 nm. Accordingly, it is clear that the term light is not restricted to visible light only, but in the present application is used for all electromagnetic radiation that can find application in microlithography.

The disclosure is particularly suitable for immersion projection exposure systems in which high radiation stresses can result on account of the high numerical aperture, especially in the last optical element, which is in contact with the immersion fluid.

The projection exposure system can, in particular, also include optical elements made of quartz or flint glass in which the above-described radiation damage can occur.

In particular, the at least one optical element for which the illumination stress and/or state parameters are determined can be the last optical element of the projection lens. In addition, in particular, optical elements in or near a pupil plane, in both the illumination system and in the projection lens, can be selected for determining the illumination stress and/or the state parameters.

BRIEF DESCRIPTION OF THE FIGURES

Further advantages, characteristics and features of the disclosure are apparent from the following detailed description of embodiments with reference to the accompanying drawings, in which:

FIGS. 3a and 3b depict an intensity distribution in a pupil plane with the impact of a plurality of downstream optical elements.

DETAILED DESCRIPTION

Figure 1:
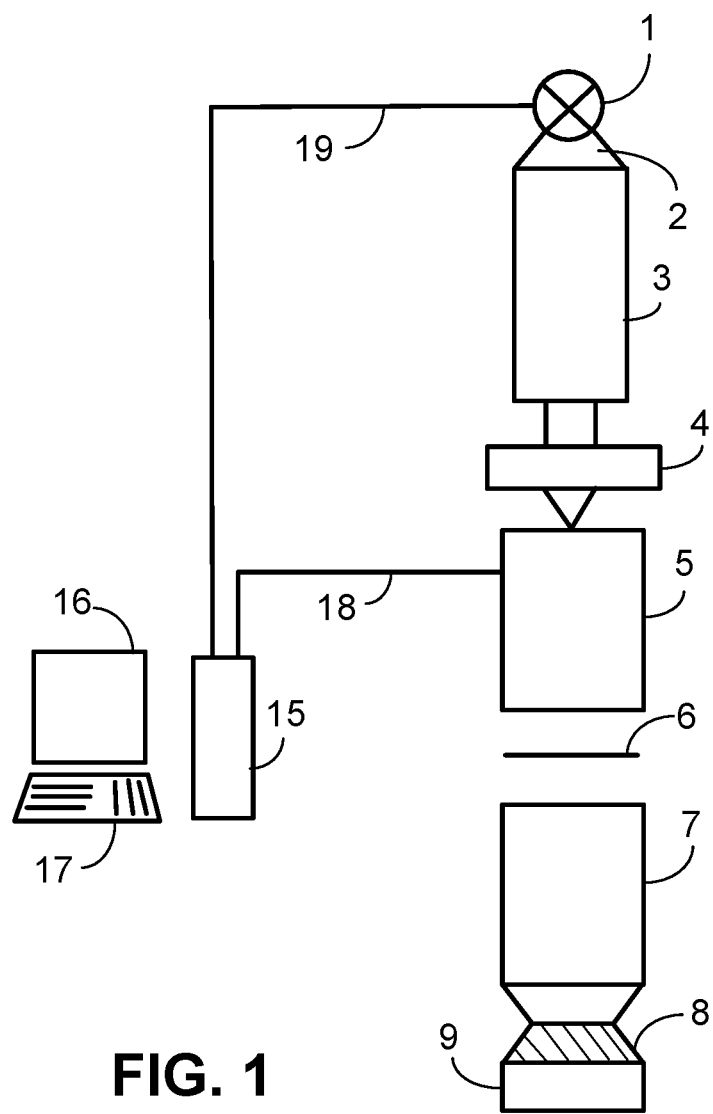
FIG. 1 depicts a projection exposure system.

FIG. 1 shows a depiction of a projection exposure system in a purely schematic form. The projection exposure system includes a light source 1 in the form of a laser, particularly a pulsed laser, which emits corresponding light beams 2 to a beam-shaping unit 3. At the end of the beam-shaping unit 3 or at the light inlet to an illumination optics 5, is provided a pupil-defining element 4, such as a diffractive optical element DOE 4. This influences the intensity distribution in a pupil plane of the illumination optics 5, thus ensuring the angular distribution of the light that impinges on the reticle 6 arranged downstream of the illumination optics 5.

By replacing the diffractive optical element DOE 4, for example, different illumination settings can be realized.

A reduced image of the structure of the reticle 6 is projected onto the substrate 9 by the projection lens 7. The illustrated embodiment of FIG. 1 is an immersion lens or an immersion projection exposure system, in which a liquid 8 for the purpose of influencing the refraction of light accordingly is arranged between the projection lens 7 and the substrate 9 or the light-sensitive layer thereon.

The projection exposure system further includes a data processing device 15 with memory, which is connected via signal lines 18, 19 to sensors or measuring points (not shown in greater detail) which serve to detect the light intensity in the ray path of the projection exposure system as well as the number of pulses of the light source 1.

Moreover, the data processing unit 15 contains a stored computer program for performing open- and/or closed-loop control of the projection exposure system. With the information transmitted via signal lines 19 and 18 on the number of pulses and the measured illumination intensity, the illumination stress in the different components or in the various optical elements of the projection exposure system can be calculated. Based on the information on the number of illumination pulses of the laser (light source 1) via signal line 19 and the illumination stress, which can be derived from the measured light intensity for the optical elements, state parameters can be determined for the individual optical elements of the projection exposure system, the parameters containing information on the duration of usage and the intensity of the illumination stress. Accordingly, with the inventive process executed via the computer program in the data processing device, it can be determined whether or not the radiant power of the light source lies in a tolerable range for the optical elements of the projection exposure system or the manner in which the radiant power affects the lifetime of the individual optical elements. A display 16 enables the corresponding values to be displayed, while a keyboard 17 allows the user to make inputs for the purpose of changing the radiant power and the like. It is also possible, for example, to make inputs about the intended future usage, so that this can be used for determining the permissible radiant power.

Figure 2:
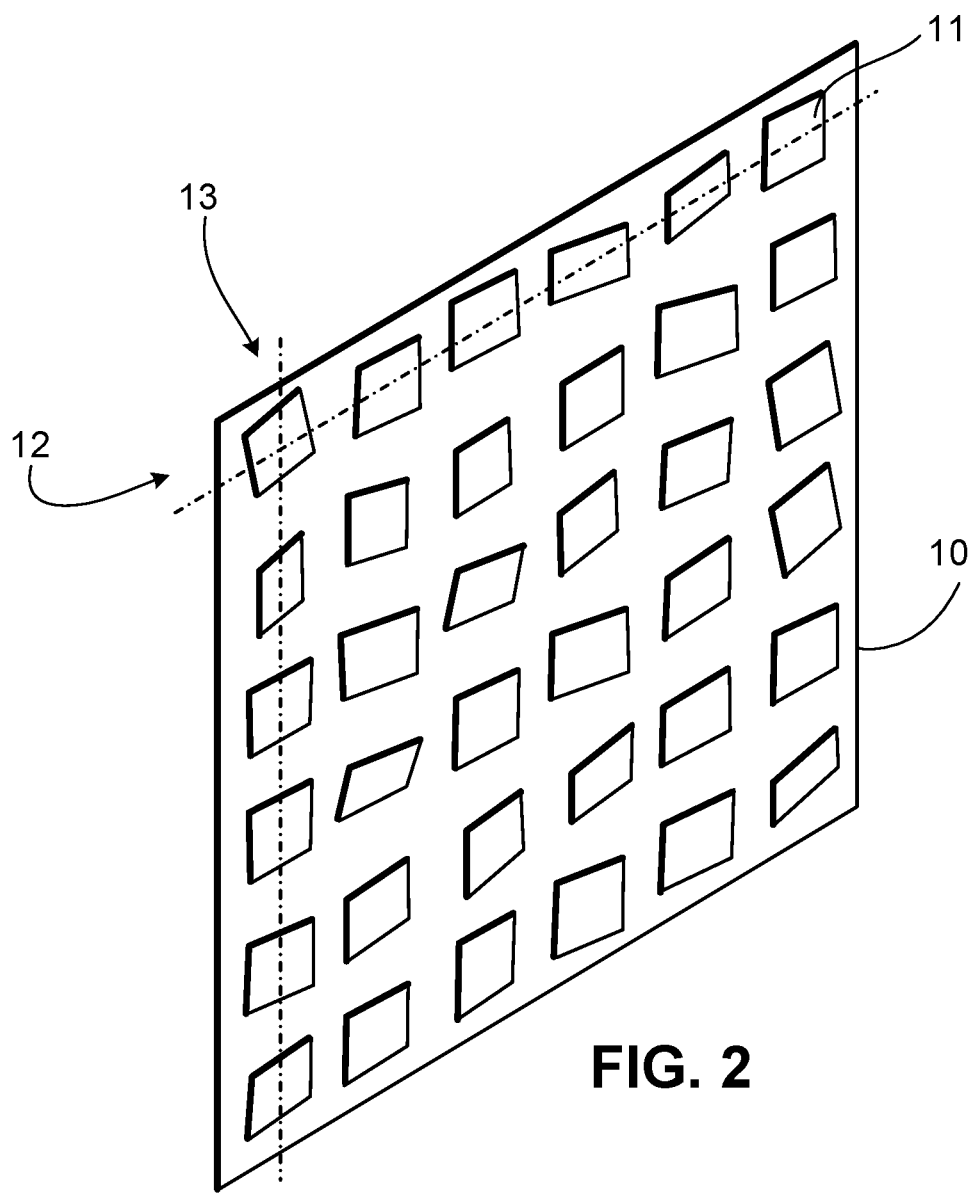
FIG. 2 depicts a mirror array or a micro mirror array (MMA)

Whereas, in the embodiment shown in FIG. 1, the diffractive optical element is replaced to allow a different illumination setting though a different diffractive optical element 4, pupil-defining elements 4 which are variably adjustable are conceivable, too, such as mirror arrays. An example of such a mirror array or micromirror array (MMA) 10 is shown in FIG. 2. A plurality of small movable mirrors 11 is arranged in rows 12 and columns 13. The mirrors 11 are disposed such that they are tiltable, for example, about axes along the rows 12 or columns 13, so that corresponding intensity distributions can be set in a pupil plane of the illumination optics 5.

Insofar as the data processing unit 15 of a corresponding projection exposure system has received transmitted information about the selected mirror settings and the resulting associated intensity distribution in a pupil plane, the illumination stress for a given radiant power of the light source 1 can be calculated and it can be determined whether or not the radiant power is within the tolerable range for the optical elements.

A given illumination setting, such as a dipole setting, as shown schematically on the left side of FIGS. 3a and 3b, can give rise to high surface stress or energy density in individual optical elements, such that damage to the material of the optical elements due to the high energy density is to be feared.

The left side of FIG. 3a shows the pupil plane 20 in which the optical axis is at the intersection of the x- and y-axes. In the pupil plane 20 and at locations 21, 22 along the x-axis two intensity maxima, so-called poles, are formed, for example by the diffractive optical element 4 or the MMA 10, which ensure a specific angular distribution during illumination of the reticle. The dipole illumination along the x-axis ensures intensity maxima at the locations 29, 30, 31, 32, for example, in the optical elements 25, 26, 27, 28, which are arranged in the ray path of the projection exposure system, and are shown in perspective view in FIGS. 3a and 3b and can be formed for example by optical lenses. On account of the intensity maxima at locations 29 to 32, the optical element material in the optical elements 25 to 28 experiences increased stress, a fact which can lead to various kinds of damage, such as compaction, depletion and rarefraction, formation of micro-channels, rupture of chemical bonds and the like. This can be possible on one hand when a certain threshold value of a permissible energy stress is exceeded or can add up over the period of usage or radiation stress, even at low does of radiation stress.

In accordance with the disclosure, exceeding the threshold values due to overly high light stress on account of the selected illumination setting can be prevented, because illumination stresses are automatically determined, when, for example, rapid switching into a different illumination setting via an MMA 10 occurs, as is shown in FIG. 3b. FIG. 3b shows a dipole illumination with the dipoles along the y-axis, as a result of which a change occurs in the positions 33, 34, 35 and 36 of the intensity maxima in the optical elements 25 to 28. Accordingly, illumination stress takes place in regions that are different from the regions 37 (shaded regions) pre-damaged through illumination by the illumination setting of FIG. 3a. Besides the change in the spatial position of the maximum intensity in the individual optical elements, the value of the energy density, too, can be changed by altering the illumination setting, such that exceeding of the threshold would need to be feared. As a result of the automated determination of the illumination stress for preferably all optical elements of the projection exposure system on account of the setting of the mirrors 11 in mirror array 10 and corresponding adjustment of the radiant power of the light source, damage to the optical elements can be avoided. In addition, as a result of recording the usage of the optical elements 25 to 28, the aggregation of damage over time until a permissible threshold limit for overall stress is exceeded can furthermore be ruled out. For example, given usage of a projection exposure system with the two illumination settings as shown in FIGS. 3a and 3b, the illumination stress of the individual optical elements 25 to 28 could always lie below the threshold value for sudden damage. However, repetitive stress of the same spatial points of the optical elements 25 to 28 could lead to aggregation of the damage, such that the lifetime of the optical elements 25 to 28 would be finished after a defined usage period. This can be prevented by the recording in a so-called logbook, i.e. a memory unit of the data processing unit 15, because the respective stress state is known from the state parameters for the optical elements 25 to 28 and further usage, at least for the next exposure, can be adjusted accordingly.

For the purpose of simplifying recording, sectors or regions of the optical elements, for example, can be specified, as indicated, for example, by the cross-hairs for the optical element 25, such that only one state parameter need be stored for each quadrant of the optical element 25. However, spatially resolved recording can also be realised for one optical element, e.g. in an N-dimensional vector for N points on the optical surface of the optical element.

Figure 4:
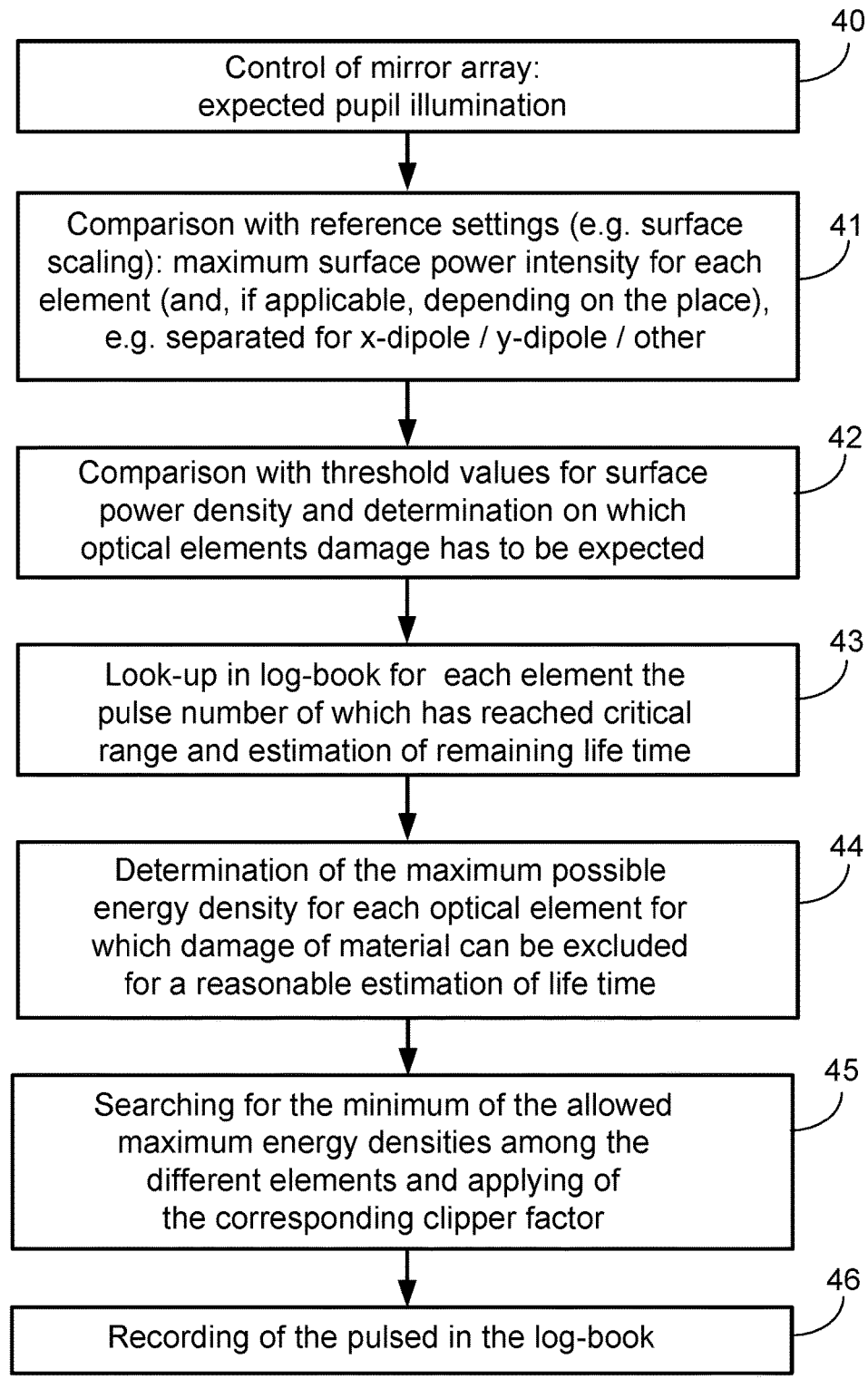
FIG. 4 depicts a flow chart for the inventive operation of a projection exposure system.

The operation of a corresponding projection exposure system can now proceed in the following manner, as shown in FIG. 4.

A mirror array 10, which serves as a pupil-defining element, can be actuated accordingly to produce a given illumination setting, such that the mirror elements 11 align themselves in the desired manner. This can be detected by the data processing unit 15 (step 40), whereby, proceeding from a reference illumination for which certain values of the light intensity and the like in different places of the projection exposure system are known, the illumination stress for one or more optical elements can be calculated (step 41). This calculation of the illumination stress can be performed for each element, i.e. for the individual optical elements 25 to 28, with maximum surface power densities being determined, both for each individual optical element 25 to 28 and in the comparison of the optical elements 25 to 28.

In step 42, these determined illumination stresses are compared with stored threshold values for the optical elements 25 to 28 to establish if the illumination stress exceeds a threshold value which indicates the maximum explosure that will not damage an optical element. If this proves to be the case, the radiant power would have to be reduced. To this end, a clipping factor, i.e. a reduction factor, can then be determined accordingly, which only permits a portion of the possible maximum radiant power. For example, iterative repetition of the steps previously described for different radiant powers of the light source 1 until the threshold values in step 42 are not exceeded for any optical element 25 to 28 can enable the possible maximum usable radiant power to be determined. A knowledge of the relationship between change in the radiant power and change in the illumination stress enables a reduction to be also made to the maximum permissible radiant power direct.

Apart from the exceeding of threshold values, at which non-permissible damage occurs immediately, however, damage can add up over the usage life, even at lower illumination stresses. Accordingly, in step 43, a so-called log-book, in which existing usage and therefore the cumulative damage or the radiation stress experienced at the optical elements 25 to 28 has been stored, checks what possible damage has already been done to each optical element and to what extent further usage has an impact, i.e. whether a immediate exceeding of the threshold values of the overall stress is to be expected or in what way usage affects the remaining lifetime.

Proceeding therefrom, in step 44, a maximum possible energy density can again be determined for each optical element 25 to 28, for which purpose a corresponding future usage to be achieved can serve as a basis. For this purpose, for example, the user can make corresponding input for the planned further usage via the keyboard 17. Admittedly it is also possible that, on the basis of previous usage, extrapolation is performed for future usage and a certain lifetime to be achieved pre-supposed.

In step 45, the minimum of the permissible maximum energy densities is sought among the various optical elements in order that the maximum radiant power of the laser may be adjusted via the aforementioned clipping factors. Via the clipping factor, for example, the data processing unit 15 can control the power of the laser 1 accordingly.

In step 46, further usage again is recorded in the logbook such that, for further usage and in particular during the next change to the illumination settings, information is again available about the damage status of the individual optical elements and the distribution of the damage state over the active optical surface of the individual optical elements, such that in turn a corresponding determination of the clipping factors or setting of the radiant power of the light source to be used can be made.

The various possible embodiments can be summarized by a numbered list of characteristics or characteristic combinations, without the list being exhaustive or being a limitation on the disclosure:

1. A method of operating a projection exposure system for microlithography with at least one variably changeable component (4), wherein the illumination stress of at least one optical element of the projection exposure system is determined automatically when there is a change in at least one variably changeable component (4) and the automatically detected illumination stress is used to determine the maximum radiant power of the light source (1).
2. Method according to characteristic 1, wherein the usage of the projection exposure system is recorded and from the history of the usage at least one state parameter of at least one optical element of the projection exposure system is determined.
3. A method of operating a projection exposure system for microlithography with at least one variably changeable component, wherein the usage of the projection exposure system with regard to the setting of the variable component is recorded and, from the history of the usage, at least one state parameter of at least one optical element of the projection exposure system is determined.
4. Method in accordance with characteristic 3, wherein the illumination stress of at least one optical element of the projection exposure system is determined at the different illumination settings.
5. Method according to characteristic 3 or 4, wherein the illumination stress of at least one optical element of the projection exposure system at one setting of a variably changeable component (4) is determined in automated manner and, from the automatedly calculated illumination stress, the maximum radiant power of the light source to be used is determined.
6. Method in accordance with any of the previous characteristics, wherein the variably changeable component is an illumination system by means of which different illumination settings can be made, an adjustable pupil-defining element of an illumination system or a replaceable reticle.
7. Method in accordance with any of the previous characteristics, wherein the radiant power of the light source (1) is automatically set or determined.
8. Method in accordance with any of characteristics 2 to 7, wherein the radiant power of the light source (1) is automatically set or determined with allowance for the state parameter(s).
9. Method in accordance with any of characteristics 1, 2 or 4 to 8, wherein the illumination stress of an optical element is determined as surface power density.
10. Method in accordance with any of characteristics 1, 2 or 4 to 9, wherein the illumination stress of one or more optical elements is calculated for an assumed radiant power of a light source.
11. Method in accordance with any of characteristics 1, 2 or 4 to 10, wherein the illumination stress of several or all optical elements is determined.
12. Method in accordance with any of characteristics 1, 2 or 4 to 11, wherein the illumination stress of an optical element is determined with spatial resolution across the optical surface or averaged for regions or sectors of the optical surface of the optical element.
13. Method in accordance with any of characteristics 1, 2 or 4 to 12, wherein the illumination stress is determined by calculation and/or measurement.
14. Method in accordance with any of characteristics 1, 2 or 4 to 13, wherein a reference illumination is used for the determination of the illumination stress.
15. Method in accordance with characteristic 14, wherein the illumination stress during the reference illumination is used to calculate back to the illumination stress in the case of other illumination settings.
16. Method in accordance with any of characteristics 1, 2 or 4 to 15, wherein the determination of the illumination stress proceeds typologically for various illumination settings.
17. Method in accordance with any of characteristics 1, 2 or 4 to 16, wherein a maximum illumination stress of an optical surface of one optical element and/or of several optical elements is determined.
18. Method in accordance with characteristics 2 to 17, wherein the recording of the usage of the projection exposure system includes the storing of the type of the illumination setting and/or the duration of the illumination and/or the number of illumination pulses and/or the intensity and/or the surface power density of the illumination stress and/or the spatial distribution of the illumination stress of one or more optical elements.
19. Method in accordance with any of characteristics 2 to 18, wherein several state parameters or one state parameter vector for different spatial regions or sectors of an optical element are determined.
20. Method in accordance with any of characteristics 2 to 19, wherein the state parameter includes an integrated overall illumination stress as a function of time and/or intensity and/or surface power density.
21. Method in accordance with any the previous characteristics, wherein the illumination stress determined for one illumination setting is compared with one or more stored threshold values and/or one or more determined state parameters for the optical elements, and the radiant power of the light source is adjusted such that it falls below the threshold values for all optical elements and/or the state parameters for all optical elements do not attain stored values for the overall illumination stress following illumination, and/or a residual lifetime prediction issues for the selected illumination setting.
22. Method in accordance with characteristic 21, wherein the adjustment of the radiant power of the light source proceeds iteratively.

23. Method in accordance with any of characteristics 21 to 22, wherein clipping factors are calculated for the adjustment of the radiant power of the light source.
24. Method in accordance with any of characteristics 21 to 23, wherein the adjustment of the radiant power of the light source proceeds automatically or proposals for adjustment or the lifetime prediction are generated automatically.
25. Method in accordance with any of characteristics 21 to 24, wherein the previous usage and/or the future usage are incorporated for the adjustment of the radiant power of the light source and/or the lifetime prediction.
26. Projection exposure system for microlithography with a control unit, with which at least the radiant power of the light source is controlled, and at least one variably changeable component, wherein the projection exposure system includes at least one determination unit, which is configured for the automated determination of the illumination stress of at least one optical element of the projection exposure system for a setting or adjustment of the at least one variably adjustable component (4), wherein the control unit (15) for the purpose of determining the maximum radiant power of the light source to be used is determined on the basis of the determined illumination stress.
27. Projection exposure system for microlithography with at least one variably changeable component (4), wherein the projection exposure system includes a recording unit, which records the usage of the projection exposure system as a function of the setting of the variably changeable component, and an evaluation unit, which uses the history of the usage to calculate at least one state parameter of at least one optical element of the projection exposure system.
28. Projection exposure system for microlithography in accordance with any of characteristics 26 or 27, wherein the variably changeable component is an illumination system by means of which different illumination settings can be made, an adjustable pupil-defining element of an illumination system or a replaceable reticle.
29. Projection exposure system for microlithography in accordance with any of characteristics 26 to 28, wherein at least one pupil-defining element is arranged in the form of a mirror array (10) or of a replaceable diffractive optical element in the illumination system in the projection exposure system.
30. Projection exposure system for microlithography in accordance with any of characteristics 26 to 29, wherein the wavelength of light is less than or equal to 400 nm.
31. Projection exposure system for microlithography in accordance with any of characteristics 26 to 29, wherein the wavelength of light is less than or equal to 250 nm.
32. Projection exposure system for microlithography in accordance with any of characteristics 26 to 31, wherein it is an immersion projection exposure system.
33. Projection exposure system for microlithography in accordance with any of characteristics 26 to 32, wherein the projection exposure system includes optical elements of quartz or flint glass.
34. Projection exposure system for microlithography in accordance with any of characteristics 26 to 33, wherein the last optical element of the projection lens or a near-pupil optical element, particularly a near-pupil optical element of small optically free radius or high surface power density (illumination stress) is at least the one optical element for which the illumination stress is determined and/or at least one state parameter is determined.
35. Projection exposure system for microlithography in accordance with any of characteristics 26 to 34, wherein the projection exposure system is configured such that it can be operated in accordance with the method of any of the characteristics 1 to 25.

Although the disclosure has been described in detail using the attached embodiments, it is obvious to a person skilled in the art that the disclosure is not restricted to these embodiments, but rather that modifications or changes in the context of the enclosed claims are possible, especially a different combination of the presented characteristics and also the omission of individual characteristics. The disclosure relates especially to any combination of all the presented features.

What is claimed is:

1. A method of operating a microlithography projection exposure system comprising an adjustable component, the method comprising:
    adjusting the adjustable component from a first setting in which the microlithography projection exposure system has a first optical condition to a second setting in which the microlithography projection exposure system has a second optical condition;
    after adjusting the adjustable component from the first setting to the second setting, determining the second optical condition of the microlithography projection exposure system;
    recording settings of the adjustable component to provide a recorded history of the settings of the adjustable component;
    based on the recorded history of the settings of the adjustable component, determining a state parameter of the microlithography projection exposure system; and
    based on: a) the determined second optical condition of the microlithography projection exposure system; and b) the state parameter of the microlithography projection exposure system, determining a maximum radiant power of a light source to be used in the microlithography projection exposure system so that the optical condition of the microlithography projection exposure system at the maximum radiant power is below a threshold.
2. The method of claim 1, wherein the threshold comprises a damage threshold.
3. The method of claim 2, wherein the microlithography projection exposure system comprises an optical element, and the damage threshold comprises a damage threshold of the optical element.
4. The method of claim 3, wherein the microlithography projection exposure system comprises a projection objective, and the optical element is in the projection objective.
5. The method of claim 4, wherein the optical element comprises a lens.
6. The method of claim 3, wherein the optical element comprises a lens.
7. The method of claim 3, wherein the optical condition comprises an illumination stress of the optical element.
8. The method of claim 1, wherein the microlithography projection exposure system comprises an optical element, and the threshold is based on an energy absorption property of the optical element for radiation having the wavelength of radiation emitted by the light source.
9. The method of claim 1, wherein the microlithography projection exposure system comprises an optical element, and the threshold is based on a change in a density property of the optical element for radiation having the wavelength of radiation emitted by the light source.

10. The method of claim 1, wherein the microlithography projection exposure system comprises an optical element, and the threshold is based on a change chemical bonds property of the optical element for radiation having the wavelength of radiation emitted by the light source.

11. The method of claim 1, wherein the optical condition comprises an illumination stress.

12. The method of claim 1, wherein the adjustable component comprises an illumination system having an adjustable illumination setting.

13. The method of claim 1, wherein the adjustable component comprises an adjustable pupil-defining element of an illumination system.

14. The method of claim 1, wherein the adjustable component comprises a reticle.

15. The method of claim 14, wherein the reticle comprises a replaceable reticle.

16. The method of claim 1, wherein determining the optical condition comprises calculating the optical condition.

17. The method of claim 1, wherein determining the optical condition comprises measuring the optical condition.

18. The method of claim 1, wherein the optical condition is determined via reference illumination.

19. A method of operating a microlithography projection exposure system comprising an adjustable component and an optical element, the method comprising:
    adjusting the adjustable component from a first setting in which the optical element has a first optical condition to a second setting in which the optical element has a second optical condition;
    after adjusting the adjustable component from the first setting to the second setting, determining the second optical condition of the optical element;
    recording settings of the adjustable component to provide a recorded history of the settings of the adjustable component;
    based on the recorded history of the settings of the adjustable component, determining a state parameter of the optical element; and
    based on: a) the determined second optical condition of the optical element; and b) the state parameter of the optical element, determining a maximum radiant power of a light source to be used in the microlithography projection exposure system so that the optical condition of the optical element at the maximum radiant power is below a threshold.

20. A projection exposure system, comprising:
    a control unit configured to control a radiant power of a light source;
    an adjustable component configured so that a change from a first setting of the adjustable component to a second setting of the adjustable component changes an optical condition of the projection exposure system from a first optical condition of the projection exposure system to a second optical condition of the projection exposure system;
    a recording unit configured to record settings of the adjustable component to provide a recorded history of the settings of the adjustable component;
    an evaluation unit configured to calculate a state parameter of the projection exposure system based on the recorded history of the settings of the adjustable component; and
    a determination unit configured to determine the second optical condition,
    wherein:
        the control unit is configured to determine a maximum radiant power of the light source based on; a) the determined second optical condition of the projection exposure system; and b) the state parameter of the projection exposure system so that the optical condition at the maximum radiant power is below a threshold; and
        the projection exposure system is a microlithography projection exposure system.

21. A projection exposure system, comprising:
    an optical element;
    a control unit configured to control a radiant power of a light source;
    an adjustable component configured so that a change from a first setting of the adjustable component to a second setting of the adjustable component changes an optical condition of the optical element from a first optical condition of the optical element to a second optical condition of the optical element;
    a recording unit configured to record settings of the adjustable component to provide a recorded history of the settings of the adjustable component;
    an evaluation unit configured to calculate a state parameter of the optical element based on the recorded history of the settings of the adjustable component; and
    a determination unit configured to determine the second optical condition of the optical element,
    wherein:
        the control unit is configured to determine a maximum radiant power of the light source based on: a) the determined second optical condition of the optical element; and b) the state parameter of the optical element so that the optical condition of the optical element at the maximum radiant power is below a threshold; and
    the projection exposure system is a microlithography projection exposure system.

* * * * *

UNITED STATES PATENT AND TRADEMARK OFFICE
CERTIFICATE OF CORRECTION

PATENT NO.         : 9,696,631 B2
APPLICATION NO.    : 14/742176
DATED              : July 4, 2017
INVENTOR(S)        : Bernhard Kneer, Markus Deguenther and Toralf Gruner It is certified that error appears in the above-identified patent and that said Letters Patent is hereby corrected as shown below:

Page 2, Column 1, Line 1 under "OTHER PUBLICATIONS", delete "Patentabilty" and insert -- Patentability --.

Column 2, Line 51, after "determined", insert -- . --.

Column 11, Line 33, delete "rarefraction," and insert -- rarefaction, --.

Column 11, Line 38, delete "does" and insert -- doses --.

Column 17, Line 41, Claim 19, delete "on;" and insert -- on: --.

Column 18, Line 17, Claim 20, delete "on;" and insert -- on: --.

Signed and Sealed this
Twenty-ninth Day of August, 2017

Joseph Matal
*Performing the Functions and Duties of the
Under Secretary of Commerce for Intellectual Property and
Director of the United States Patent and Trademark Office*